United States Patent [19]

Pawlowski et al.

[11] Patent Number: 4,839,254
[45] Date of Patent: Jun. 13, 1989

[54] PHOTOSENSITIVE MIXTURE AND PHOTOSENSITIVE RECORDING MATERIAL PRODUCED THEREFROM WITH POLYMERIC BINDER WHICH IS REACTION PRODUCT OF (THIO) PHOSPHINIC ACIDISO (THIO) CYANATE AND ACTIVE HYDROGEN CONTAINING POLYMER

[75] Inventors: Georg Pawlowski, Wiesbaden; Hans-Jerg Kleiner, Kronberg, both of Fed. Rep. of Germany

[73] Assignee: Hoechst Aktiengesellschaft, Frankfurt am Main, Fed. Rep. of Germany

[21] Appl. No.: 47,103

[22] Filed: May 8, 1987

[30] Foreign Application Priority Data

May 9, 1986 [DE] Fed. Rep. of Germany ....... 3615613

[51] Int. Cl.$^4$ ............... G03C 1/60; G03C 1/68; G03C 1/71
[52] U.S. Cl. .................... 430/175; 430/176; 430/192; 430/196; 430/197; 430/270; 430/281; 430/284; 430/906; 430/908; 430/909
[58] Field of Search ............. 430/175, 176, 197, 196, 430/192, 270, 281, 284, 906, 908, 909

[56] References Cited

U.S. PATENT DOCUMENTS

| | | | |
|---|---|---|---|
| 3,453,237 | 7/1969 | Borden et al. | 260/47 |
| 3,655,625 | 4/1972 | Thomas | 430/156 |
| 3,732,105 | 5/1973 | Klupfel et al. | 96/115 P |
| 3,767,409 | 10/1973 | Grisdale et al. | 430/196 |
| 3,867,147 | 2/1975 | Teuscher | 430/176 |
| 4,289,838 | 9/1981 | Rowe et al. | 430/906 |
| 4,316,949 | 2/1982 | Patrellis et al. | 430/160 |
| 4,387,151 | 6/1983 | Bosse et al. | 430/175 |
| 4,391,894 | 7/1983 | Shimazu et al. | 430/196 |
| 4,427,765 | 1/1984 | Mohr et al. | 430/160 |
| 4,458,007 | 7/1984 | Geisler et al. | 430/284 |
| 4,695,527 | 9/1987 | Geissler et al. | 430/256 |

FOREIGN PATENT DOCUMENTS 2095854 10/1982 United Kingdom ............... 430/175

OTHER PUBLICATIONS

Research Disclosure, "Phosphorus containing photo-crosslinkable polymers", Jun. 1973, Band 177, Mr/ 110, pp. 72–80, Nr. 11027, Industrial Opportunities Ltd. GB.
Photopolymers: Principles, Processes & Materials, Regional Technical Conference, "Photocrosslinkable polyphosphonates having unusual resistance to acids", Douglas G. Borden, Oct. 1973, pp. 10–19, Society of Plastics Engineers, Inc.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A photosensitive mixture contains a photosensitive compound and a polymeric binder which is a reaction product of a compound represented by the formula

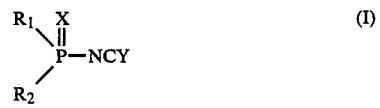

wherein
X and Y are the same or different, and each denotes oxygen or sulfur,
R$_1$ and R$_2$ are the same or different, and each denotes an unsubstituted or substituted alkyl, cycloalkyl or alkoxy radical containing from 1 to 6 carbon atoms; an unsubstituted or substituted aryl or aryloxy radical containing from 6 to 10 carbon atoms; or, together with the phosphorus atom, a 5- or 6-membered heterocyclic ring which is unsubstituted or substituted or which carries a fused benzene ring, with a polymer containing active hydrogen. The novel binders used in the mixture can be easily prepared and yield photosensitive layers of good developability and developer resistance.

11 Claims, No Drawings

PHOTOSENSITIVE MIXTURE AND PHOTOSENSITIVE RECORDING MATERIAL PRODUCED THEREFROM WITH POLYMERIC BINDER WHICH IS REACTION PRODUCT OF (THIO) PHOSPHINIC ACIDISO (THIO) CYANATE AND ACTIVE HYDROGEN CONTAINING POLYMER

BACKGROUND OF THE INVENTION

The present invention relates to a photosensitive mixture that contains a photosensitive compound and a polymeric binder which is insoluble in water and soluble or swellable in aqueous-alkaline solutions, and that is especially suitable for producing printed circuits, using the resist technique, and lithographic printing plates for offset printing.

Mixtures of this general type are known from German Offenlegungsschrift No. 2,053,363. They contain, as binders, reaction products of a polymer containing hydroxyl or amino groups and at least one saturated alkyl-, alkoxy-, aryl- or aryloxysulfonyl isocyanate. The binder is processed in combination with diazonium salt condensation products or photopolymerizable mixtures to form photosensitive layers. The mixtures obtained in this way can be developed under aqueous-alkaline conditions only if the binders used have high acid numbers, as a result of which the abrasion resistance and the printing properties of the cured layer are adversely influenced.

Similar mixtures are described in German Offenlegungsschrift No. 2,053,364. They contain reaction products of polymers containing hydroxyl or amino groups and unsaturated sulfonyl isocyanates, an initiator and, optionally, other polymerizable compounds. Reaction products of the same type in combination with diazonium salt polycondensates or low-molecular azides are described in German Offenlegungsschrift No. 3,036,077.

A disadvantage of these mixtures is the complicated and expensive production of the necessary alkenylsulfonyl isocyanates. Moreover, the printing plates produced from these mixtures exhibit an inadequate ink receptivity, so that an unacceptably high output of waste paper is produced during the proofing process and after a prolonged stoppage.

SUMMARY OF THE INVENTION

It is therefore an object of the present invention to provide a photosensitive mixture that possesses the advantages of known mixtures containing binders prepared from sulfonyl isocyanates, but that (1) yields photosensitive layers with better abrasion resistance after exposure and printing plates with better ink receptivity and (2) can be produced from readily available starting materials.

It is also an object of the present invention to provide a photosensitive recording material characterized by superior surface properties, such as enhanced ink receptivity and resistance to undercutting.

In accomplishing the foregoing objects, there has been provided, in accordance with one aspect of the present invention, a photosensitive mixture comprising a photosensitive compound in a polymeric binder which is a reaction product of a compound represented by the formula

wherein

X and Y are the same or different, and each is oxygen or sulfur, $R_1$ and $R_2$ are the same or different, and each is an unsubstituted or substituted alkyl, cycloalkyl or alkoxy radical containing from 1 to 6 carbon atoms; an unsubstituted or substituted aryl or aryloxy radical containing from 6 to 10 carbon atoms; or, together with the phosphorus atom in formula (I), a 5- or 6-membered heterocyclic ring which is unsubstituted or substituted or which carries fused benzene ring, with a polymer containing active hydrogen.

In one preferred embodiment, the photosensitive compound in the photosensitive mixture is a photo initiator for polymerization by free radicals, and the mixture further comprises a polymerizable compound having at least one ethylenic double bond.

In accordance with another aspect of the present invention, there has also been provided a photosensitive recording material comprising a support and a photosensitive layer provided on the support, which layer contains a photosensitive compound and a polymeric binder, insoluble in water and soluble or swellable in aqueous-alkaline solutions, that is a reaction product as described above.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The polymeric binders contained in a mixture according to the present invention have, as functional groups, lateral (thio)phosphinylurethane, (thio)phosphinylthiourethane, (thio)phosphinylurea or (thio)phosphinylthiourea groups. These compounds are produced by reacting compounds of the formula (I) with polymers containing active hydrogen, for example, polymers containing hydroxyl or amino groups, and the active hydrogen is supplied by hydroxyl or amino groups.

$R_1$ and $R_2$ in formula (I) are preferably alkyl or alkoxy radicals containing from 1 to 4 carbon atoms, in particular from 1 to 2 carbon atoms, or unsubstituted or substituted phenyl or phenoxy radicals. Halogen atoms, particularly chlorine, and alkyl radicals or alkoxy radicals containing from 1 to 4 carbon atoms are suitable as substituents. The aromatic $R_2$ radicals can contain from 1 to 3 substituents, and preferably from 1 to 2 substituents, or can be unsubstituted.

Moreover $R_1$ and $R_2$ together can form a phosphorus-heterocyclic ring system that can also comprise more than one 5- or 6-membered ring which is unsaturated and/or substituted. Suitable ring systems include those derived from phosphole, phospholine, phospholane, phosphorinane, diphosphane and phosphindole, phosphindoline, isophosphindoline, tetrahydrophosphinoline and tetrahydroisophosphinoline as the parent substances.

The following are exemplary of the preferred (thio)-phosphinic acid iso(thio)-cyanates of formula (I):
Dimethylphosphinic acid isocyanate,
Dimethylthiophosphinic acid isocyanate,
Dimethylphosphinic acid isothiocyanate,
Ethylmethylthiophosphinic acid isothiocyanate,
Diethylphosphinic acid isocyanate,
Diethylthiophosphinic acid isothiocyanate,
Methylbutylphosphinic acid isocyanate,
Dibutylphosphinic acid isocyanate,
Dihexylphosphinic acid isocyanate,
Chloromethylmethylphosphinic acid isocyanate,
Chloromethylethylphosphinic acid isocyanate,
Methylphenylphosphinic acid isocyanate,
Methylphenylphosphinic acid isothiocyanate,
Diphenylphosphinic acid isocyanate,
Diphenylphosphinic acid isothiocyanate,
Ethoxyphenylphosphinic acid isocyanate,
Diethoxyphosphinic acid isocyanate,
Diethoxyphosphinic acid isothiocyanate,
Dibutoxyphosphinic acid isocyanate,
Diphenoxythiophosphinic acid isocyanate,
1-isocyanato-1-oxo-2,3-dihydrophosphole,
1-isocyanato-1-oxo-2,5-dihydrophosphole.

The (thio)phosphinic acid derivatives mentioned above can be prepared from the corresponding (thio)-phosphinic acid chlorides represented by the formula

wherein $R_1$, $R_2$ and $X$ have the meanings specified above, by reaction with inorganic cyanates or thiocyanates. The preparation of these intermediate products is described for example, in Houben-Weyl, METHODEN DER ORGANISCHEN CHEMIE ("Methods of Organic Chemistry"), Vol. E2, at page 241.

The polymers that are capable of reacting with these compounds and that contain active hydrogen are preferably polymers having hydroxyl or amino groups. Among these, the polymers that bear hydroxyl groups are preferred to those containing amino groups because the polymers containing urethane groups have substantially better solubility in aqueous-alkaline developer solutions than do those that have urea groups. In addition, the reaction products containing urea groups are frequently more brittle and more difficult to process.

The good solubility of the polymers having (thio)urethane or (thio)urea groups in aqueous-alkaline solutions results from the acidic character of the hydrogen atoms bonded to the nitrogen as a consequence of activation by adjacent carbonyl or phosphinic acid groups.

For example, vinyl or allyl alcohol polymers can be used as starting polymers containing hydroxyl groups. Preferably, vinyl alcohol polymers are used, in particular partially acetalated or partially esterified polyvinyl alcohols. Among these polyvinyl alcohol polymers, polyvinylacetals are preferred, with polyvinylformals and polyvinylbutyrals having mean molecular weights between 5,000 and 200,000 or more, preferably of 10,000 to 100,000, and containing 5% to 30% by weight of vinyl alcohol units, being particularly preferred.

Allyl alcohol copolymers can contain, as exemplary comonomer units, styrene or substituted styrene units, the allyl alcohol component preferably amounting to between 10% and 40% by weight. In addition, copolymers of vinyl or allyl alcohol with vinyl esters, vinyl ethers, vinylidene chloride, acrylates, methacrylates or (meth)acrylonitrile can be used as starting materials.

Homopolymers or copolymers of hydroxyalkyl(meth)acrylates or glycerol mono(meth)acrylates with other known (meth)acrylates, such as methyl(meth)acrylate, hexyl(meth)acrylate, (meth)acrylonitrile and the like, can likewise be used with favorable results as starting polymers containing hydroxyl groups, if they contain more than 10% by weight of hydroxyalkyl(meth)acrylate or glycerol mono(meth)acrylate units.

Epoxy resins, for example, condensation products of 2,2,-bis(4-hydroxyphenyl)propane and epichlorohydrin, and reaction products of partially reacted glycidyl(meth)-acrylates, can also be used with advantage in the present invention, provided these polymers have an adequate number of free reactive hydroxyl groups and have molecular weights between 2,000 and 200,000.

Cellulose ethers and cellulose esters are likewise suitable, provided they have unreacted hydroxyl groups. Particularly useful in this regard are the partial esters with low aliphatic carboxylic acids, such as cellulose acetate. Suitable cellulose ethers are, for example, mixed alkyl hydroxyalkyl ethers of the celluloses. Preferably between 0.3 and 2.3 free hydroxyl groups should be present per glucose unit.

The condensable polyesters which are useful in the present invention include those compounds that are not completely esterified and that contain hydroxyl groups resulting from branchings or terminal hydroxyl groups. For these compounds, the degree of branching should not be too high.

Finally, compounds containing amino groups can also be used as starting polymers for the reaction with ethylenically unsaturated (thio)phosphinic acid isocyanates and isothiocyanates of formula (I). The resulting polymers are not preferred due to their frequently observable brittleness. In addition, they can often not be developed rapidly enough with an aqueous-alkaline developer solution, the polymers occasionally adhering too strongly to the metallic substrate. Nevertheless, copolymers of N-vinyl-N-methylamine, and also of polyamides, such as polycaprolactam, and of polyurethanes, including reaction products of diisocyanates with dihydric or polyhydric alcohols and of polyamideimides can be used to advantage in the present invention.

If a photosensitive mixture containing a polymeric binder in accordance with the present invention is employed in the offset field, then reaction products with polyvinylacetals are especially preferred. Copolymers of hydroxyalkyl (meth)acrylate having low molecular weights are especially suitable when a mixture of the present invention is used in the resist technique.

The quantitative proportion of the polymers in the mixture according to the present invention is generally 20% to 95% by weight, preferably 40% to 90% by weight, based on the nonvolatile constituents in the mixture.

The production of polymers suitable for use in the present invention is not difficult, since the (thio)phosphinic acid isocyanates and isothiocyanates of formula (I) react exceedingly easily with groupings that have active hydrogen atoms. It is possible from time to time, consequently, to dispense with an addition of catalysts or an increase in the reaction temperature.

In general, to produce the polymeric binders, 2% to 25% by weight of the polymer containing active hydrogen is dissolved in a suitable inert solvent such as dioxane, tetrahydrofuran, ethylene glycol dimethyl ether, ethylene glycol diacetate or butanone, and the corresponding isocyanate, preferably dissolved in the same solvent, is added dropwise at room temperature. Under these conditions a slight rise in temperature of the reaction mixture can be observed.

If the isothiocyanates of formula (I) are reacted, it is expedient to add a catalyst, for example, diazabicyclo[2,2,2]octane, to the mixture described above, and/or to heat the mixture.

0.4 to 1.4 mol of (thio)phosphinic acid isocyanate and 0.4 to 1.7 mol of (thio)phosphinic acid isothiocyanate are preferably added per mol of active hydrogen, since an excess of formula (I) compounds is necessary for a quantitative reaction of all the reactive groups of the starting polymer.

The alkali-soluble polymers may be processed further in the reaction solution, optionally after destroying excess isocyanate or isothiocyanate, by adding an alcohol, like ethanol.

For characterization purposes or for special applications, the polymer can be isolated by adding it dropwise to 10 times the quantity of a nonsolvent, preferably slightly acidified water, under which circumstances it is provided as a colorless-to-slightly-yellowish, amorphous product which, in general, can readily be filtered. Before being used in the photosensitive mixture according to the present invention, the product should be adequately dried.

The polymeric binders thus obtained produce, in combination with the most varied negative-working photosensitive substances, including diazonium salt polycondensates, photopolymerizable mixtures, azido derivatives and quinone diazides, layers that can be developed readily and without scumming with aqueous-alkaline solutions. These layers are also distinguished by high abrasion resistance and excellent thermal stability, and can therefore be used for numerous potential applications, particularly in production of lithographic plates and photoresists.

Virtually all known, negative-working photosensitive substances can be used in the present invention, provided they are compatible with the polymer matrix. For instance, diazonium salt polycondensation products, for example, condensation products of condensable aromatic diazonium salts with aldehydes, are excellently suited. Exemplary of these are condensation products of diphenylamine-4-diazonium salts with formaldehyde. Advantageously, cocondensation products are also used which, in addition to the diazonium salt units, contain further, nonphotosensitive units derived from condensable compounds. Such condensation products are known from German Offenlegungsschriften Nos. 2,024,242, 2,024,243 and 2,024,244. Generally all diazonium salt condensates are suitable that are described in German Offenlegungsschrift No. 2,739,774.

Photopolymerizable mixtures comprising a photopolymerizable monomer or oligomer and photoinitiators can advantageously be used as photosensitive components in a mixture according to the present invention, particularly in the field of printed circuits.

Suitable polymerizable compounds are known from U.S. Pat. Nos. 2,760,683 and 3,060,023. Examples are esters of acrylic acid or methacrylic acid, such as diglycerol diacrylate, guaiacol glycerol ether acrylate, neopentylglycol diacrylate, 2,2-dimethylolbutan-3-ol diacrylate, pentaerythritol tri- and tetraacrylate, and also the corresponding methacrylates. Furthermore, acrylates or methacrylates which contain urethane groups are suitable, as are acrylates or methacrylates of polyesters that contain hydroxyl groups. Finally, prepolymers containing allyl or vinyl groups are also suitable, those monomers or oligomers being preferred that contain at least two polymerizable groups per molecule.

The polymerizable compounds can in general be present in a mixture of the present invention in a quantity of up to 50% by weight, preferably 10% to 35% by weight, based on the nonvolatile constituents in the mixture.

Numerous substances can be used as photoinitiators in photosensitive mixtures according to the invention. Examples are benzoins, benzoin ethers, polynuclear quinones such as 2-ethylanthraquinone, acridine derivatives such as 9-phenylacridine and benzacridine, phenazine derivatives such as 9,10-dimethylbenz[a]phenazine, quinoxaline and quinoline derivatives such as 2,3-bis(4-methxyphenyl)-quinoxaline and 2-styrylquinoline, quinazoline compounds and acylphosphine oxide compounds. Photoinitiators of this type are described in German patent Nos. 2,027,467 and 2,039,861 and European patent application No. 11,786. Also suitable are hydrazones, mercapto compounds, pyrylium and thiopyrylium salts, synergistic mixtures with ketones or hydroxy ketones and dyestuff redox systems. Especially preferred are photoinitiators having trihalomethyl groups that can be split by light, in which connection mention should be made, in particular, of corresponding compounds from the triazine or thiazoline series. Such compounds are described in German Offenlegungsschriften Nos. 2,718,259, 3,333,450 and 3,337,024. A particularly preferred triazine photoinitiator is 2-(4'-methoxystyryl)-4,6-bistrichloromethyl-s-triazine.

The photoinitiators are in general added in quantitative proportions of 0.1% to 15% by weight, preferably of 0.5% to 10% by weight, based on the nonvolatile constituents of the mixture.

For certain applications low- or higher-molecular azido derivatives are especially suitable as photosensitive compounds, low-molecular azido compounds containing at least two azido groups per molecule being preferred. Illustrative compounds of this type are 4,4'-diazidostilbenes, 4,4'-diazidobenzophenones, 4,4'-diazidobenzalacetophenones, 4,4'-diazidobenzalacetones and 4,4'-diazidobenzalcyclohexanones. The photosensitivity of such azido compounds may be increased by the optional use of suitable sensitizers, for example, 1,2-benzanthraquinone. Furthermore, those polyfunctional azides are suitable that display an intrinsic absorption so displaced by conjugation with doublebonds in the molecule that no additional sensitization is necessary during exposure. Additional suitable azido compounds are known from British published application No. 790,131, German patent No. 950,618 and U.S. Pat. No. 2,848,328.

Moreover, low-molecular diazo compounds, such as p-quinone diazides and p-iminoquinone diazides, can be used as photosensitive compounds in the present invention. Such mixtures are, however, not preferred because of their relatively low photosensitivity.

The quantity of photosensitive cross-linkable compound contained in photosensitive mixture of the present invention is generally between 5% to 60% by weight, preferably 10% to 40% by weight, based on the nonvolatile constituents of the mixture.

The mixtures according to the present invention can be processed in a conventional manner, according to their application. For this purpose, the polymeric reaction product is dissolved in a suitable solvent or solvent mixture, for example, ethylene glycol monomethyl ether, ethylene glycol monoacetate, dioxane, tetrahydrofuran or butanone. A coating can then be obtained from the resulting solution, which is mixed with a photosensitive substance that is soluble in the mixture.

As a function of the nature of the photosensitive compound employed, furthermore, the following additives can be added to the photosensitive coating solution:

(a) For sensitizing with diazo compounds, for example, p-quinone diazides or diazonium salt condensates:
  a dyestuff for rendering the photosensitive layer visible on the support material; an acid, preferably phosphoric acid, for stabilizing the diazonium salt; and a contrast agent which produces an intensification of the color change in the layer on exposure, (b) For sensitization with azido compounds:
  a dyestuff which contributes to rendering the photosensitive layer visible and to increasing the sensitivity of the photocrosslinking compound in the desired spectral range, and (c) For sensitizing with photopolymerizable substances:
  inhibitors that suppress any thermally initiated polymerization.

Other additives, such as plasticizers, pigments, further resin components, etc., can be added to the photosensitive mixture if they prove suitable for the particular application. Such additives, their action and possibilities of use are known to those skilled in the art.

The solutions obtained as described above are filtered for the purpose of further processing, in order to remove any undissolved constituents, and are applied to a suitable support material in a known manner, for example, by knife-coating or spinning. The coating thus applied is then dried. Support materials that are suitable for the coating include, among others, aluminum which has been grained mechanically or electrochemically and optionally anodized and post-treated; aluminum-clad foil or foil otherwise rendered hydrophilic; foil copper-coated in vacuum and multimetal foils. In this context, the type of application depends to a considerable extent on the desired layer thickness of the photosensitive layer, the preferred layer thicknesses of the dried layer being between 0.5 μm and 200 μm.

After adequate drying, the materials can be converted to their respective application form, in a known manner, by imagewise exposure using a negative film original or, with suitable sensitization, using a laser beam and subsequent development.

In this connection, development is preferably carried out with aqueous-alkaline developer solutions having a pH value in the range between about 8 and 13. Optionally, the developers can contain additives that contribute to an accelerated, technically appropriate development operation. Suitable additives for this purpose are, in particular, surfactants or small quantities of a low-volatility organic solvent, such as benzyl alcohol. The composition of suitable developer solutions for the photosensitive layers according to the invention is primarily dependent on the particular application; however, they should contain, as a rule, more than 75% by weight of water and less than 5% by weight of an organic solvent. Suitable developer solutions are known, for example, from German Offenlegungsschriften Nos. 2,809,774, 3,100,259 and 3,140,186.

The mixtures according to the present invention make it possible to produce lithographic printing plates yielding very large print runs. These exhibit a favorable ink receptivity while retaining favorable copying properties. For this field of application, reaction products of polyvinylacetals and phosphinic acid isocyanates of formula (I) are particularly suitable as binders. The lithographic printing plates obtained from photosensitive mixtures containing these polymers exhibit, in addition, a capability for easy, scum-free development with aqueous-alkaline developer solutions, and a very favorable storage stability.

Moreover, photoresist stencils with excellent resolution can be obtained with the mixtures according to the present invention. For this application, reaction products of copolymers of hydroxyalkyl(meth)acrylate with phosphinic acid isocyanates of formula (I) are preferable as binders.

The examples below are intended to explain the invention and its possible applications in more detail. Parts by weight (p.b.w.) and parts by volume (p.b.v.) are in the ratio of g/cm³; percentages and quantitative ratios are to be understood in parts by weight, unless otherwise specified.

PREPARATION EXAMPLE 1:
Ethylmethylphosphinic acid isocyanate 58 g of sodium cyanate were added in portions to 112 g of ethylmethylphosphinic acid chloride in 200 ml of absolute acetonitrile, such that a temperature of 30° C. was not exceeded in the process. The reaction mixture was stirred for three days. Then the salt produced was filtered off by suction and the solvent removed in a water-jet vacuum. The residue was distilled. 72 g of a colorless, very mobile liquid (60.5% of theory) having a boiling point of 75°–77° C./100 Pa were isolated.

PREPARATION EXAMPLE 2: Dibutoxyphosphinic acid isocyanate

Analogously to Example 1, 200 g of dibutoxyphosphinic acid chloride were reacted with 58 g of sodium cyanate in 350 ml of absolute acetonitrile. 142 g of a faintly yellowish liquid (69% of theory) having a boiling point of 80°–83° C./0.67 Pa were isolated.

PREPARATION EXAMPLE 3:
Dimethylthiophosphinic acid isocyanate

Analogously to Example 1, 112 g of dimethylthiophosphinic acid chloride were reacted with 58 g of sodium cyanate in 200 ml of absolute acetonitrile. 98 g of colorless crystals (81% of theory) having a melting point of 77°–79° C. (recrystallization from toluene) were isolated.

PREPARATION EXAMPLE 4: Reaction of a polyvinylbutyral with ethylmethylphosphinic acid isocyanate 20 g of a polyvinylbutyral having a molecular weight of about 70,000 to 80,000 and containing 71% by weight of vinylbutyral units, 2% by weight of vinylacetate units and 27% by weight of vinyl-alcohol units were dissolved in 350 g of tetrahydrofuran. A solution of 10.6 g of ethylmethylphosphinic acid isocyanate in 50 g of tetrahydrofuran was added dropwise with stirring within ten minutes to the clear solution at room temperature. The temperature of the mixture rose by about 3° to 5° C. The reaction mixture was stirred for four hours at room temperature and then was added dropwise to 5,000 g of water. The white, fibrous product thus obtained was filtered off by suction and vacuum-dried at 50° C. 28 g of a polymer having an acid number of 80 were obtained.

PREPARATION EXAMPLE 5: Reaction of a styrene-allyl alcohol copolymer with dibutoxyphosphinic acid isocyanate 20 g of a styrene-allyl alcohol copolymer having a molecular weight of about 1,600 and an OH number of about 225 were dissolved in 300 g of tetrahydrofuran. 14 g of dibutoxyphosphinic acid isocyanate in 50 g of tetrahydrofuran were added dropwise with stirring to the solution at room temperature. The mixture, which warmed up slightly, was stirred for four hours at room temperature and then was added dropwise to 4,000 g of distilled water. In the process, a granular polymer resulted, which was filtered off by suction and dried at 50° C. 31 g of a colorless polymer having an acid number of 95 were obtained.

PREPARATION EXAMPLE 6: Reaction of a hydroxyl-group containing polyester with dimethylthiophosphinic acid isocyanate 20 g of a polyester (Desmophen 650 ®, Bayer AG) having an OH number of about 250 were dissolved in 300 g of butanone. To the clear, stirred solution 0.2 g of diazabicyclo[2,2,2]octane were added, followed by the dropwise addition, at room temperature, of 15 g of dimethylthiophosphinic acid isocyanate in 50 g of butanone. The mixture, which warmed up only negligibly in the process, was stirred for four hours at about 55° C. to complete the reaction. After the mixture had cooled down, 30 g of ethanol were added to decompose any excess isocyanate, and the clear solution was added dropwise to 5,000 g of water. The precipitated fine-grain granulate was filtered off and dried. 29 g of a yellowish, brittle product having an acid number of 63 were isolated.

Further binder variants can be synthesized by methods similar to the above-described methods of preparation.

APPLICATION EXAMPLE 1

20 p.b.w. of a polyvinylbutyral which had a molecular weight above 80,000 and which contained 77%-80% by weight of vinylbutyral units, 2% by weight of vinylacetate units and 18%-21% by weight of vinyl-alcohol units were dissolved in 350 p.b.w. of tetrahydrofuran to give a clear solution. 17 p.b.w. of 1-isocyanato-1-oxo-2,5-dihydrophosphole (prepared by reacting 1-chloro-1-oxo-2,5-dihydrophosphole with sodium cyanate) in 50 p.b.v. of tetrahydrofuran were added dropwise to this solution at room temperature. The mixture was stirred for four hours, admixed with 50 p.b.w. of ethanol, and then added dropwise to 5,000 p.b.w. of vigorously stirred distilled water. A fibrous, amorphous product resulted, which was filtered off by suction and dried. Obtained in this fashion were 29 p.b.w. of a white polymer which had an acid number of 83 and was composed of C: 55.6%, H: 8.2%, N: 3.2% and P: 8.7%.

A coating solution was prepared from 34.8 p.b.w. of the above-described reaction product,
11.6 p.b.w. of a diazonium-salt polycondensation product prepared from 1 mol of 3-methoxy-diphenylamine-4-diazonium sulfate and 1 mol of 4,4'-bis(methoxymethyl)diphenylether in an 85% strength phosphoric acid and isolated as the mesitylene sulfonate,
1.4 p.b.w. of phosphoric acid (85% strength),
1.8 p.b.w. of Victoria Pure Blue FGA (C.I. Basic Blue 81) and
0.4 p.b.w. of phenylazodiphenylamine in
1650.0 p.b.w. of ethylene glycol monomethyl ether and
320.0 p.b.w. of tetrahydrofuran.

The filtered solution was applied to an 0.3 mm thick aluminum foil which had been grained by brushing with an aqueous abrasive suspension and thereafter pretreated with an 0.1% strength aqueous solution of polyvinyl phosphonic acid. When the solution was dried, a photosensitive layer resulted which had a dry-layer weight of 0.97 g/m$^2$.

The layer was exposed for 28 seconds under a negative original, using a 5 kW metal halide lamp. The exposed layer was treated with a developer solution composed of 5.0 p.b.w. of sodium lauryl sulfate,
1.5 p.b.w. of sodium metasilicate×5 H$_2$O and
1 0 p.b.w. of trisodiumphosphate×12 H$_2$O in
92.5 p.b.w. of demineralized water, using a plush pad. Immediately after wetting, the nonexposed layer areas were removed by the developer solution. The plate was then rinsed with water and dried.

Step 5 of a silver-film continuous-tone step wedge having a density range from 0.05 to 3.05 and density increments of 0.15 was completely reproduced in the copy. Even the finest screens and lines of the original were clearly shown. The printing plate obtained in this manner produced 35,000 good impressions on a sheet-fed offset machine.

APPLICATION EXAMPLE 2

42 g of benzaldehyde were dispersed with stirring in 400 ml of a 13.5% strength aqueous solution of a polyvinyl alcohol (Mowiol ® 4-98, Hoechst AG). A solution of 0.5 g of 2,6-di-tert-butyl-1,4-cresol, 0.5 g of sodium dodecyl sulfate and 27.5 g of concentrated hydrochloric acid in 80 ml of water was added dropwise to this mixture. The mixture was continuously stirred at room temperature and the polyvinylacetal was gradually precipitated in the process. After four hours, another 20 g of concentrated hydrochloric acid were added dropwise and stirring was continued for two hours at 35° C. The product was separated from the aqueous solution, dissolved in 2-methoxyethanol and reprecipitated from water. 80 g of a white, fibrous material were obtained, which exhibited a degree of acetalation of 52%.

20 g of the dried benzaldehyde acetal thus obtained were dissolved in 500 ml of tetrahydrofuran. 22 g of ethylmethylphosphinic acid isocyanate were added, dropwise and with stirring, to the clear solution at room temperature. After five hours, this mixture was added dropwise to 5,000 g of water. The precipitated product was dried in vacuo and had an acid number of 109.

A coating solution comprised of 86.5 p.b.w. of the above-described binder,
29 p.b.w. of the diazonium-salt polycondensate described in Example 1,
3.5 p.b.w. of phosphoric acid (85% strength), 4.3 p.b.w. of Victoria Pure Blue FGA (C.I. Basic Blue 81) and
1 p.b.w. of phenylazodiphenylamine in
4200 p.b.w. of ethylene glycol monomethyl ether
was coated onto an aluminum foil which had been electrochemically grained in nitric acid and then anodically oxidized and post-treated with polyvinyl phosphonic acid. The dry-layer weight was 1.03 g/m².

Further processing was carried out according to Example 1. A printing plate was obtained which was excellently ink-receptive in the image areas and scum-free in the non-image areas. The printing plate mounted in a sheet-fed offset machine yielded more than 140,000 impressions of impeccable quality.

APPLICATION EXAMPLE 3

A coating solution was prepared from
26.8 p.b.w. of an 8% strength solution of the reaction product described in Preparation Example 5 in tetrahydrofuran,
2.2 p.b.w. of 2,6-bis(4-azidobenzal)4-methylcyclohexanone and
0.3 p.b.w. of Rhodamine 6 GDN Extra (C.I. 45 160) in
120 p.b.w. of ethylene glycol monomethyl ether and
30 p.b.w. of butylacetate.

The solution was applied to the support described in Example 2, such that a dry-layer weight of 0.8 g/m² was obtained. Processing was effected as in Example 1. The printing plate thus obtained produced several ten thousands of good impressions on a sheet-fed offset machine.

APPLICATION EXAMPLE 4

Analogously to Preparation Example 4, a reaction product was synthesized from (a) 20 g of a polyvinylbutyral containing 71% by weight of vinylbutyral units, 2% by weight of vinyl-acetate units and 27% by weight of vinyl-alcohol units and (b) 12.8 g of chloromethylmethylphosphinic acid isocyanate in 400 g of tetrahydrofuran. After drying, the product had a composition of C: 53.2%, H: 8.3%, N: 2.4%, P: 5.8% and Cl: 6.5% and an acid number of 61.

A coating solution was prepared from
26.7 p.b.w. of an 8% strength solution of the above-described reaction product in tetrahydrofuran,
2.2 p.b.w. of the bisazido compound described in Application Example 3,
0.3 p.b.w. of Rhodamine 6 GDN Extra (C.I. 45 160) and
0.2 p.b.w. of 2-benzoylmethylene-1-methyl-$\beta$-napthothiazoline in
100 p.b.w. of ethylene glycol monomethyl ether and
50 p.b.w. of tetrahydrofuran.

The solution was applied to the support described in Application Example 2 to give a dry-layer weight of 0.72 g/m². The photosensitive layer was then exposed for 35 seconds under a negative original, using a 5 kW metal halide lamp, and a readily visible, dark red image resulted. A plush pad was used for treating the layer with a developer solution comprised of
5 p.b.w. of sodium lauryl sulfate and
1 p.b.w. of sodium metasilicate×5 H₂O in
94 p.b.w. of water.

In the process, the non-image areas were removed. After rinsing with water, step 5 of the silver-film continuous-tone step wedge described in Application Example 1 was blackened upon inking. The printing plate obtained produced a print run of more than 160,000 sheets on a sheet-fed offset machine.

APPLICATION EXAMPLE 5

A coating solution was prepared from
2 p.b.w. of the binder described in Preparation Example 4,
2 p.b.w. of trimethylolpropane trimethacrylate,
0.1 p.b.w. of crystal violet (C.I. 42 555),
0.08 p.b.w. of 2-ethylanthraquinone and
0.01 p.b.w. of 4-methoxyphenol in
40 p.b.w. of ethylene glycol monomethyl ether.

After filtering, the solution was applied to an aluminum foil which had been pretreated as described in Application Example 2, and dried for 2 hours at 100° C. to give a dry-layer weight of 4 g/m². The dry layer was coated with a 3% strength polyvinyl alcohol solution which dried to give a weight of about 1 g/m². After exposure under a negative, the plate was developed with a strength trisodium phosphate solution.

Within 30 seconds, a clear image was obtained which was wiped over with a 1% strength aqueous solution of phosphoric acid and then inked with a protective ink. The printing plate accepted the protective ink in an excellent manner and produced large print runs on the customary offset presses.

APPLICATION EXAMPLE 6

A coating solution was prepared from
2 p.b.w. of a polymer which was obtained by reacting the polyvinylbutyral used in Application Example 1 with diphenylphosphinic acid isocyanate and had an acid number of 94. (C: 61.7%, H: 8.5%, N: 2.8%, P: 5.8%),
2.2 p.b.w. of the reaction product obtained from 1 mol of 2,2,4-trimethyl-hexamethylene-diisocyanate and 2 mols of hydroxyethyl methacrylate,
0.2 p.b.w. of 2-(4'-methoxystyryl)-4,6-bis-trichloromethyl-s-triazine and
0.06 p.b.w. of an azo dye of 2,4-dinitro-6-chloro-benzene diazonium salt and 2-methoxy-5-acetylamino-N-cyanoethyl-N-hydroxyethylaniline in
26 p.b.w. of butanone and
14 p.b.w. of butylacetate.

The solution was spin-coated onto an aluminum support which had been pretreated as in Application Example 2, such that a dry-layer weight of about 4.3 g/m² was obtained.

The dried plate was exposed for 40 seconds under a continuous-tone step wedge, using 5 kW metal halide lamp arranged at a distance of 110 cm from the vacuum frame. Then the plate was manually developed using a developer of the following composition:
3.0 p.b.w. of sodium metasilicate×9 H₂O and
0.04 p.b.w. of a non-ionic wetting agent (coconut oil alcohol polyoxyethylene ether having about 8 oxyethylene units) in
96.96 p.b.w. of water.

A printing plate having 5 fully-crosslinked wedge steps was obtained which yielded 180,000 highly resolved impressions when mounted in a sheet-fed offset machine.

APPLICATION EXAMPLE 7

A terpolymer of 50% by weight of hydroxyethyl methacrylate, 20% by weight of methyl methacrylate and 30% by weight of hexyl methacrylate was admixed with an excess of ethylmethylphosphinic acid isocyanate, such that all hydroxyl groups were converted into phosphinylurethane moieties. The polymer obtained had a mean molecular weight of approximately 32,000.

A solution was prepared from
6.5 p.b.w. of the above-described reaction product,
5.6 p.b.w. of a technical-grade mixture of pentaerythritoltrimethacrylate and pentaerythritol-tetramethacrylate,
0.2 p.b.w. of 2-(4'-methoxystyryl)-4,6-bis-trichloromethyl-s-triazine and
0.03 p.b.w. of the azo dye indicated in Application Example 6 in
25 p.b.w. of butanone,
2 p.b.w. of ethanol and
1 p.b.w. of butylacetate.

This solution was spin-coated onto a 25 μm-thick, biaxially drawn and heat-set polyethylene therephthalate film, such that a dry-layer weight of 35 g/m² was obtained after drying at 100° C.

A laminating device was used to laminate the dry-resist film thus produced at 120° C. to a phenoplast laminate clad with a 35 μm-thick copper foil. The resulting plate was exposed for 25 seconds under a commercial exposure apparatus. The original used was a line original with line widths and distances down to 80 μm.

After exposure, the polyester film was peeled off and the layer thereby obtained was developed for 90 seconds in a spray developing apparatus with a developer solution having the composition indicated in Application Example 6. The plate was then rinsed for 30 seconds with tap water, slightly etched for 30 seconds in a 15% strength ammonium peroxydisulfate solution, and then electroplated in the following electrolytic baths:
(1) for 30 minutes in a copper electrolyte manufactured by Schloetter, Geislingen/Steige,
type "Glanzkupfer-Bad"
current density: 2.5 A/dm²,
metal build-up: about 14 μm.
(2) for 10 minutes in a nickel bath of the same manufacturer,
type "Norma"
current density: 4 A/dm²,
metal build-up: 9 μm.

The plate did not show any damage or undercutting. Stripping was performed in a 5% strength KOH solution at 50° C. The uncovered copper was removed by etching with customary etching media.

APPLICATION EXAMPLE 8

A coating solution was prepared from
16.0 p.b.w. of an 8.0% strength solution of the reaction product described in Preparation Example 6 in butanone,
0.725 p.b.w. of the diazonium-salt polycondensation product described in Application Example 1,
0.072 p.b.w. of phosphoric acid (85% strength),
0.01 p.b.w. of phenylazodiphenylamine and
0.07 p.b.w. of crystal violet (C.I. 42 555) in
140 p.b.w. of ethylene glycol monomethyl ether
and spin-coated onto an aluminum support which had been pretreated as described in Application Example 2, such that a dry-layer weight of 0.8 g/m² was obtained The exposed layer was immersed for 15 seconds into a vessel containing the developer solution described in Application Example 4. After rinsing with tap water, an image of the original was obtained which showed defined edges and produced several thousands of good impressions.

APPLICATION EXAMPLE 9

20 p.b.w. of the polyvinylbutyral specified in Preparation Example 4 were reacted, as described in that example, with 19.4 p.b.w. of ethylmethylphosphinic acid isocyanate in 300 p.b.w. of tetrahydrofuran to give a product having an acid number of 148.

A coating solution was prepared from
30.3 p.b.w. of the above-described reaction product,
15.1 p.b.w. of the diazonium-salt polycondensate indicated in Application Example 1,
1.2 p.b.w. of phosphoric acid (85% strength),
1.1 p.b.w. of phenylazodiphenylamine and
1.5 p.b.w. of Victoria Pure Blue FGA (C.I. Basic Blue 81) in
1600 p.b.w. of ethylene glycol monomethyl ether.

The solution was applied to an aluminum support which had been electrolytically grained in hydrochloric acid, anodically oxidized and post-treated with polyvinyl phosphonic acid, and then dried to give a layer weight of 1.2 g/m².

The presensitized printing plate was exposed, developed and used for printing on a sheet-fed offset machine, as described in Application Example 1. A print run of about 200,000 excellent impressions was obtained.

APPLICATION EXAMPLE 10

The printing plate obtained in Application Example 4 was subjected to a baking treatment after exposure and development. In the process, the material was gummed and then heated for 5 minutes at 220° C. The cooled printing plate was used for printing in a sheet-fed offset machine. More than 250,000 high-resolution impressions were obtained.

APPLICATION EXAMPLE 11

Analogously to Preparation Example 4, 15 p.b.w. of a terpolymer that comprised 91% of vinyl chloride, 3% of vinyl acetate and 6% of vinyl alcohol, and that had a mean molecular weight of 15,000 and a softening point of approximately 75° C., were reacted with 8 p.b.w. of diphenylphosphinic acid isocyanate. The product obtained had an acid number of 47.

A coating solution was prepared from
44.9 p.b.w. of an 8.03% strength solution of the above-described reaction product in tetrahydrofuran,
1.8 p.b.w. of the diazonium-salt polycondensate mentioned in Application Example 1,
0.2 p.b.w. of phosphoric acid (85% strength),
0.1 p.b.w. of Victoria Pure Blue FGA (C.I. Basic Blue 81) and
0.06 p.b.w. of phenylazodiphenylamine in
150.0 p.b.w. of ethylene glycol monomethyl ether.

The solution was applied to an aluminum foil which had been electrochemically grained, anodically oxidized and post-treated with polyvinyl phosphonic acid. The photosensitive layer had a layer weight of 0.96 g/m² after drying. Processing was performed analogously to Application Example 4. This printing plate yielded a large print run when used for printing on a sheet-fed offset machine.

APPLICATION EXAMPLE 12

A coating solution was prepared from
1.5 p.b.w. of the reaction product described in Preparation Example 4, but which had an acid number of 80, 0.5 p.b.w. of a diazonium-salt polycondensation product obtained from 1 mol of 3-methoxydiphenylamine-4-diazonium sulfate and 1 mol each of 4-methoxymethyl-4'-methyldiphenylether and 1,4-bis-methoxymethylbenzene, precipitated as the 2-hydroxy-4-methoxybenzophenone-5-sulfonate,
0.1 p.b.w. of Victoria Pure Blue FGA (C.I. Basic Blue 81),
1.5 p.b.w. of pentaerythritol triacrylate and pentaerythritol tetraacrylate (technical-grade mixture),
0.1 p.b.w. of 2-(4'-styrylphenyl)-4,6-bis-trichloromethyl-s-triazine and
0.05 p.b.w. of phosphoric acid (85% strength) in
48.0 p.b.w. of ethylene glycol monomethyl ether and
42.0 p.b.w. of tetrahydrofuran.

The solution was applied to an aluminum sheet which had been electrochemically grained, anodically oxidized and post-treated with polyvinylphosphonic acid. The solution was dried to give a layer weight of 1.8 g/m$^2$. The resulting printing plate was exposed under an appropriate test original and developed with a developer having the following composition:
0.2 p.b.w. of sodium metasilicate×9 H$_2$O,
3.9 p.b.w. of disodiumhydrogen phosphate×12 H$_2$O,
3.5 p.b.w. of trisodium phosphate×12 H$_2$O,
1.5 p.b.w. of potassium tetraborate×4 H$_2$O, and
2.9 p.b.w. of sodium octyl sulfate in
88.0 p.b.w. of demineralized water.

The developed printing plate produced more than 200,000 impressions in a sheet-fed offset press.

APPLICATION EXAMPLE 13

The terpolymer described in Application Example 7 was reacted with an excess of dimethylthiophosphinic acid isocyanate, such that all hydroxyl groups were converted into thiophosphinylurethane moieties.

A coating solution was prepared from
6.5 p.b.w. of the above-described reaction product,
5.6 p.b.w. of 4,4'-bis-($\beta$-acryloyloxyethoxy)diphenyl-ether,
0.2 p.b.w of 2-(4'-methoxystyryl)-4,6-bis-trichloromethyl-s-triazine and
0.03 p.b.w. of the azo dye described in Application Example 6 in
25.0 p.b.w. of butanone,
2.0 p.b.w. of ethanol and
1.0 p.b.w. of butylacetate
and processed analogously to Application Example 7. The solution was spin-coated onto a phenoplast laminate clad with a 35 μm-thick copper foil, such that a dry-layer weight of 30 g/m$^2$ was obtained.

The plate was then exposed, developed and electroplated, but instead of being nickel-plated, it was treated for 15 minutes in a lead-tin bath LA, manufactured by Schloetter, Geislingen/ Steige, at a current density of 1 A/dm$^2$ (metal build-up: 15 μm). This plate similarly did not show any damage or undercutting. Stripping was carried out, as described in Application Example 7, in a 5% strength KOH solution at 50° C. The uncovered copper could be removed by etching with the customary etching medium.

APPLICATION EXAMPLES 14 to 16

Analogously to Preparation Example 4, reaction products of the polyvinylbutyral described in that example were reacted with the same molar quantities each of Application Example 14: chloromethylmethylphosphinic acid isocyanate,
Application Example 15: methylphenylphosphinic acid isocyanate,
Application Example 16: diphenylphosphinic acid isocyanate.

The binders thus obtained, having acid numbers between 60 and 80, were processed into solutions as in Application Example 1. These solutions were applied to aluminum foils which had been electrochemically grained in nitric acid, anodically oxidized and post-treated with polyvinyl phosphonic acid. Photosensitive layers having dry-layer weights of about 1 g/m$^2$ were obtained.

After imagewise exposure, the plates were developed with a developer having the composition indicated in Application Example 12. In the process, a decrease in developing speed was observed with increasing aromatic substitution of the phosphinic acid isocyanate. The developed printing plates were used for proof printing in a sheet-fed offset machine. In all three cases, the printing layer areas of the printing plate accepted ink after printing the first 5 to 6 sheets.

APPLICATION EXAMPLES 17 to 19

In these examples, different hydroxyl group-containing polymers were used, which were reacted with a constant quantity of ethylmethylphosphinic acid isocyanate. As described in Preparation Example 4, the polymers were employed in coating solutions which had compositions corresponding to the composition described in Application Example 1. Processing was effected as in Application Example 1. In all cases, high-quality copies were obtained, which clearly reproduced the finest line elements of the original. In the printing machine, the plates showed an extraordinary chemical and mechanical resistance and produced large print runs.

APPLICATION EXAMPLE 17

20 p.b.w. of the polyvinylbutyral described in Preparation Example 4 were reacted with 14 p.b.w. of ethylmethylphosphinic acid isocyanate in 350 p.b.w. of tetrahydrofuran and further processed as described in that example. The polymer had an acid number of 102 and a composition of C: 52.3%, H: 8.6%, N: 3.6% and P: 7.9%.

APPLICATION EXAMPLE 18

20 p.b.w. of a polyvinylbutyral having a molecular weight of about 80,000 and containing 79% by weight of vinylbutyral units, 2% by weight of vinyl-acetate units and 21% by weight of vinylalcohol units, were reacted with 14 p.b.w. of ethylmethylphosphinic acid isocyanate in 350 p.b.w. of tetrahydrofuran. The polymer had a composition of C: 53.9%, H: 9.3%, N: 3.4% and P: 7.4% and an acid number of 92.

APPLICATION EXAMPLE 19

20 p.b.w. of a polyvinylbutyral having a molecular weight of about 80,000 and containing 86% by weight of vinylbutyral units, 2% by weight of vinyl-acetate units and 12% by weight of vinylalcohol units, were reacted with 14 p.b.w. of ethylmethylphosphinic acid isocyanate in 350 p.b.w. of tetrahydrofuran. The polymer had a composition of C: 55.1%, H: 9.3%, N: 3.0% and P: 6.5% and an acid number of 77.

APPLICATION EXAMPLE 20

A photosensitive layer corresponding to the layer of Application Example 2 was applied to five aluminum foils which had been treated as described in that example. The five lithographic printing plates thus obtained were stored in a heating oven, which had been preheated at 100° C., for a period of one to five hours.

The cooled photosensitive layers were exposed for 25 seconds under a negative original and then developed with a developer having the following composition:
3.9 p.b.w. of $Na_2HPO_4 \times 12\ H_2O$,
1.9 p.b.w. of potassium oxalate $\times H_2O$,
1.5 p.b.w. of potassium tetraborate $\times 4\ H_2O$,
3.4 p.b.w. of $Na_3PO_4 \times 12\ H_2O$,
2 p.b.w. of phenoxyethanol,
2.5 p.b.w. of sodium benzoate and
84.8 p.b.w. of water.

While the plates stored in the heating oven for one or two hours did not show any noticeable extension of the step wedge or a delay in development speed, as compared with a plate processed in the usual manner, a marked delay of development and a reproduction of the wedge which was extended by 1 to 2 steps was observed in the plate stored for three hours. The plate stored for four hours showed a tendency to accept ink also in the non-image areas, while the plate stored for five hours could hardly be developed. The developed layer areas tended to form flakes and the non-image areas clearly accepted ink.

The results showed that the photosensitive layer was relatively insensitive to heat.

APPLICATION EXAMPLE 21

The layer described in Application Example 1 was spin-coated onto a support as specified in Application Example 2. The layer weight was about 1 g/m². Four plates of this type were stored in a cabinet that simulated tropic conditions by being heated at 40° C. and having a relative humidity of 60%. One plate each was removed after 3, 6, 9 and 12 months, exposed imagewise and developed with the developer of Application Example 20. For comparison, a plate was taken that had not been stored under these conditions and that, after exposure for 25 seconds, showed a solid step 4 of a silver-film continuous-tone step wedge having a density range from 0.15 to 1.50, with density increments of 0.15. The plates exposed after 3, 6 and 9 months did not exhibit any extensions of the step wedge. They could be developed as speedily as the original plate. The plate stored in the tropical cabinet for one year showed an extension of the step wedge by one to two steps, but it could also swiftly be developed. All plates were used for proof printing in a printing machine and did not give rise to problems concerning ink receptivity and tendency to scumming.

APPLICATION EXAMPLE 22

20 p.b.w. of a polyamide (Ultramid 1C®, BASF) were expanded for about 12 hours in 200 p.b.w. of phosphoric acid trisdimethylamide and then dissolved at 50° C., with vigorous stirring, in the course of about 4 hours. A mixture of 50 p.b.w. of the same solvent and 15 p.b.w. of 1-isocyanate-1-oxo-2,3-dihydrophosphole was added dropwise to the clear solution at about 40° C., and stirring was continued for about 8 hours while the mixture was allowed to cool to room temperature.

The mixture was precipitated by adding it dropwise to a vigorously stirred mixture of 10% of ethanol and 90% of distilled water. The precipitated mixture was filtered, rewashed and dried at room temperature. The product could be dissolved in a 1 N sodium hydroxide solution.

The binder thus obtained was used in a formulation corresponding to Application Example 1 and applied to an aluminum foil which had been electrochemically grained, anodically oxidized and post-treated. The layer weight was 1.4 g/m². After imagewise exposure and development with a developer mixture containing
5 p.b.w. of benzyl alcohol,
2 p.b.w. of sodium hydroxide and
2 p.b.w. of sodium decylsulfate in
91 p.b.w. of water,
the printing plate was mounted in a sheet-fed offset machine. Several ten thousands of impressions of good quality were obtained.

What is claimed is:

1. A photosensitive mixture comprising (a) a photosensitive negative-working substance present in an amount sufficient to render said mixture sensitive to light, and (b) a polymeric binder which is insoluble in water and soluble or swellable in aqueous-alkaline solutions, wherein said polymeric binder is present in an amount sufficient to make the photosensitive mixture soluble in an aqueous-alkaline solution and is a product of reacting (i) a compound represented by the formula

wherein
X and Y are the same or different, and each is oxygen or sulfur,
$R_1$ and $R_2$ are the same or different, and each is an unsubstituted or substituted alkyl, cycloalkyl or alkoxy radical containing from 1 to 6 carbon atoms; an unsubstituted or substituted aryl or aryloxy radical containing from 6 to 10 carbon atoms; or, together with the phosphorus atom in formula (1), a 5- or 6-membered heterocyclic ring which is unsubstituted or substituted or carries a fused benzene ring,
with (ii) a polymer containing active hydrogen, wherein said polymer contains hydroxyl or amino groups and the active hydrogen is supplied by hydroxyl or amino groups.

2. A photosensitive mixture as claimed in claim 1, wherein $R_1$ and $R_2$ are alkyl or alkoxy radicals containing from 1 to 4 carbon atoms.

3. A photosensitive mixture as claimed in claim 1, wherein $R_1$ and $R_2$ are unsubstituted or substituted phenyl or phenoxy radicals.

4. A photosensitive mixture as claimed in claim 1, wherein X and Y are oxygen atoms.

5. A photosensitive mixture as claimed in claim 1, wherein said polymer (ii) is selected from the group consisting of a polymer comprised of vinylalcohol, allyl-alcohol, hydroxyalkyl-acrylate or hydroxyalkyl-methacrylate units; an epoxy resin, a cellulose ether, a cellulose ester or polyester containing free hydroxyl groups, a polyamine, a polyamide, and a polyurethane.

6. A photosensitive mixture as claimed in claim 1, wherein (1) said photosensitive negative-working substance is a photoinitiator for polymerization by free radicals and (2) said mixture further comprises a polymerizable compound having at least one ethylenic double bond.

7. A photositive mixture as claimed in claim 6, wherein said photoinitiator contains at least one trihalomethyl group which is cleavable by exposure to actinic radiation.

8. A photosensitive mixture as claimed in claim 1, wherein said photosensitive negative-working substance is a compound which crosslinks on exposure to actinic radiation.

9. A photosensitive mixture as claimed in claim 8, wherein said compound which crosslinks on exposure is a diazonium salt, a p-quinone diazide or an organic azido compound.

10. A photosensitive recording material comprising a support and a photosensitive layer provided on said support, which layer contains (a) a photosensitive negative-working substance, and present in an amount sufficient to render said layer sensitive to light, and (b) a polymeric binder which is insoluble in water and soluble or swellable in aqueous-alkaline alkaline solutions, wherein said polymeric binder is present in an amount sufficient to make the photosensitive layer soluble in an aqueous-alkaline solution, and is a product of reacting (i) a compound represented by the formula

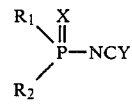

(I)

wherein

X and Y are the same or different, and each is oxygen or sulfur, $R_1$ and $R_2$ are the same or different, and each is an unsubstituted or substituted alkyl, cycloalkyl or alkoxy radical containing from 1 to 6 carbon atoms; an unsubstituted or substituted aryl or aryloxy radical containing from 6 to 10 carbon atoms; or, together with the phosphorous atom in formula (I), a 5- or 6-membered heterocyclic ring which is unsubstituted or substituted or carries a fused benzene ring, with (ii) a polymer containing active hydrogen, wherein said polymer contains hydroxyl or amino groups and the active hydrogen is supplied by hydroxyl or amino groups.

11. A photosensitive recording material as claimed in claim 10, wherein (1) said photosesnitive negative-working material is a photoinitiator for polymerization by free radicals and (2) said substance further comprises a polymerizable compound having a least one ethylenic double bond.

* * * * *

UNITED STATES PATENT AND TRADEMARK OFFICE
CERTIFICATE OF CORRECTION

PATENT NO. : 4,839,254
DATED : June 13, 1989
INVENTOR(S) : Georg Pawlowski et al It is certified that error appears in the above-identified patent and that said Letters Patent is hereby corrected as shown below:

Claim 11, line 3, change "material" to -- substance --.

Claim 11, line 2, change "photosesnitive" to -- photosensitive --.

Claim 11, line 4, change "substance" to -- mixture --.

Signed and Sealed this

Twelfth Day of March, 1991

*Attest:*

HARRY F. MANBECK, JR.

*Attesting Officer*  *Commissioner of Patents and Trademarks*